United States Patent
Sewani et al.

(10) Patent No.: US 9,553,592 B1
(45) Date of Patent: Jan. 24, 2017

(54) CIRCUITS FOR AND METHODS OF GENERATING A DIVIDED CLOCK SIGNAL WITH A CONFIGURABLE PHASE OFFSET

(71) Applicant: Xilinx, Inc., San Jose, CA (US)

(72) Inventors: Aman Sewani, Sunnyvale, CA (US); Fu-Tai An, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/639,197

(22) Filed: Mar. 5, 2015

(51) Int. Cl.
| | |
|---|---|
| H03K 21/00 | (2006.01) |
| H03K 23/00 | (2006.01) |
| H03K 25/00 | (2006.01) |
| H03K 21/02 | (2006.01) |
| H03K 5/13 | (2014.01) |

(52) U.S. Cl.
CPC ............ *H03K 21/02* (2013.01); *H03K 5/13* (2013.01)

(58) Field of Classification Search
USPC ............... 327/115, 116, 117, 118, 355–361, 202,327/203, 208–212, 218; 377/47, 48
See application file for complete search history.

(56) References Cited

U.S. PATENT DOCUMENTS

| | | | | |
|---|---|---|---|---|
| 5,202,906 A * | 4/1993 | Saito | ............... | H03L 3/00 327/105 |
| 7,728,642 B1 * | 6/2010 | O'Dwyer | ............... | H03K 5/135 327/265 |
| 9,018,996 B1 * | 4/2015 | Zarei | ............... | H03K 5/15033 327/115 |
| 2008/0106315 A1 * | 5/2008 | Jau | ............... | H03K 19/0963 327/200 |
| 2010/0195785 A1 * | 8/2010 | Behel | ............... | H03K 23/54 377/47 |
| 2012/0194229 A1 * | 8/2012 | Velayuthan | ............... | H03K 23/002 327/118 |
| 2013/0147529 A1 * | 6/2013 | Ganesan | ............... | H03L 7/1803 327/156 |
| 2013/0328600 A1 * | 12/2013 | Woelk | ............... | H03K 21/023 327/118 |

OTHER PUBLICATIONS

Tatsukawa, Jim, *MMCM and PLL Dynamic Reconfiguration*, XAPP888 (v1.3), Oct. 8, 2013, pp. 1-19, Xilinx, Inc., San Jose, California, USA.

* cited by examiner

*Primary Examiner* — Brandon S Cole
(74) *Attorney, Agent, or Firm* — John J. King (57) ABSTRACT

A circuit for generating a divided clock signal with a configurable phase offset comprises a first latch circuit adapted to receive a clock signal to be divided; a second latch coupled to an output of the first latch circuit and generating a divided output clock signal; and an initialization circuit coupled to the first latch circuit and the second latch circuit, the initialization circuit coupled to receive an initialization signal. The initialization signal determines a phase offset between the divided output clock signal and the clock signal to be divided. A method of generating a divided clock signal is also described.

9 Claims, 12 Drawing Sheets

CIRCUITS FOR AND METHODS OF GENERATING A DIVIDED CLOCK SIGNAL WITH A CONFIGURABLE PHASE OFFSET

TECHNICAL FIELD

The present invention relates generally to integrated circuit devices, and in particular to circuits for and methods of generating a divided clock signal with a configurable phase offset.

BACKGROUND

Clock division in an integrated circuit is an important function for enabling the operation of the integrated circuit. In addition to dividing a clock signal, it may be necessary in many instances to provide a phase offset to the clock signal. However, providing the correct phase for the divided clock signal can increase the circuit elements required for clock division, and can also introduce potential sources of error in the clock signal. For example, a conventional circuit for providing a divided clock signal having a phase offset includes a latch after a clock divider to implement a 90 degree phase shift. However, such an implementation has many disadvantages, including the asymmetric drive strengths of the two clock paths, a requirement for additional gates that lead to jitter in the signal path, increased power consumption in the signal path, and limited phase selection of either 0+/−90 degrees. Another conventional way to achieve a configurable phase relationship is to have multiplexers at the end of each divide-by-2 block to "flip" the clock polarity if desired. However, such an arrangement also leads to jitter in the signal, and increases power requirements because of the insertion of transmission gates in the signal path.

Accordingly, improved circuits and methods for providing offset in a divided clock signal would be advantageous.

SUMMARY

A circuit for generating a divided clock signal with a configurable phase offset is described. The circuit comprises a first latch circuit adapted to receive a clock signal to be divided; a second latch circuit coupled to an output of the first latch circuit and generating a divided output clock signal; and an initialization circuit coupled to the first latch circuit and the second latch circuit, the initialization circuit coupled to receive an initialization signal. The initialization signal determines a phase offset between the divided output clock signal and the clock signal to be divided.

According to another implementation, a circuit for generating a divided clock signal with a configurable phase offset comprises a plurality of clock divider stages, where each clock divider stage comprises: a first latch circuit adapted to receive a clock signal to be divided; a second latch circuit coupled to an output of the first latch and generating a divided output clock signal; an initialization circuit coupled to the first latch circuit and the second latch circuit, the initialization circuit coupled to receive an initialization signal; and a control circuit. Each control circuit is coupled to receive a divider select signal.

A method of generating a divided clock signal with a configurable phase offset is described. The method comprises receiving an input clock signal to be divided at a first latch circuit; coupling a second latch circuit to an output of the first latch circuit; coupling an initialization circuit to the first latch circuit and the second latch circuit; and determining, using an initialization signal, a phase offset between divided output clock signal and the input clock signal.

Other features will be recognized from consideration of the Detailed Description of the Drawings and the Claims, which follow.

DETAILED DESCRIPTION

The circuits and methods set forth below enable generating a divided clock signal with a configurable phase offset. More particularly, the circuits and methods enable implementing a programmable phase relationship between two clock signal paths that are divided down by factor of $2^n$, where n is an integer greater than or equal to 1. The circuits does not require additional gates in the signal path to implement the phase offset, leading to improved jitter and power performance compared to conventional circuits. For two signal paths designated "CK A" and "CK B", a divided down "CK A" can be programmed to be aligned with, ahead of, or behind a divided "CK B" in terms of relative phase.

The circuits and methods are capable of implementing a $360/2^n$ degrees phase relationship, where n is zero or any integer from 1 to the number of cascaded "divide-by-two" circuits. If a clock input to a divide-by-2 flip-flop (FF) is flipped by 180 degrees, and that phase difference also gets divided down by another divide-by-2 FF, the final outputs that can be selected will vary 90 degrees in phase. An efficient way of implementing the flipping of the clock input without the addition of gates in the signal path is to use FFs that can be initialized to a state of 0 or 1. If the FF is initialized to state 0, the output of the divide-by-2 FF configuration is aligned with the input clock. If the flip flop is initialized to 1, the output is 180 degrees out of phase with the input.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
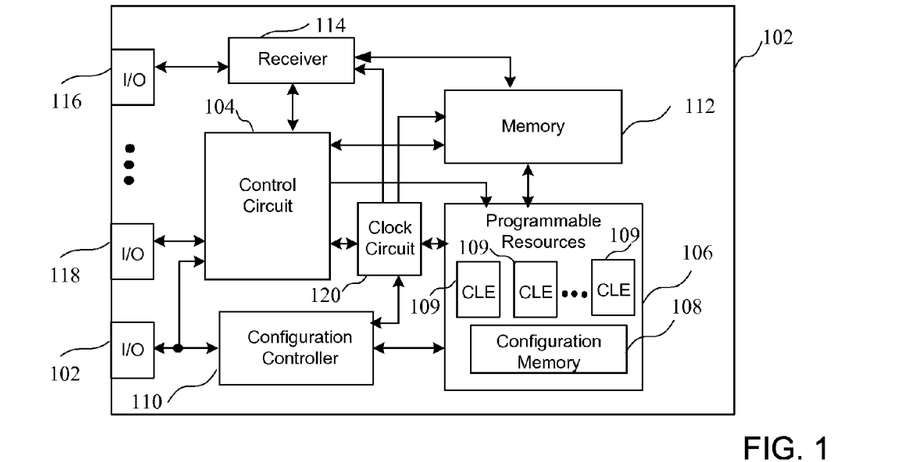
FIG. 1 is a block diagram of an integrated circuit having a clock circuit for generating divided clock signals.

Turning now to FIG. 1, a block diagram of an integrated circuit having a circuit for filtering inter-symbol interference. In particular, an input/output port 102 is coupled to a control circuit 104 that controls programmable resources 106 having configuration memory 108. Configuration data, described in more detail below in reference to FIGS. 14-16, may be provided to the configuration memory 108 by a configuration controller 110. The configuration data enables the operation of configurable elements 109, also described in more detail in reference to FIG. 16. A separate memory 112, which may be a non-volatile memory for example, may be coupled to the control circuit 104 and the programmable resources 106. A receiver 114 may be coupled to the control circuit 104 and the memory 112, and may receive signals external to the integrated circuit device or transmit signals by way of an I/O port 116. Other I/O ports may be coupled to circuits of the integrated circuit device, such as I/O port 118 that is coupled to the control circuit 104 as shown. A clock circuit 120 for generating clock signals used in the integrated circuit is also included. For example, the clock circuit 120 may receive a reference clock signal and generate various divided clocks, and more particularly divided clock signals with a configurable phase offset, as will be described in more detail below. The reference clock signal may be an external clock signal coupled to the integrated circuit, or may be generated internally within the integrated circuit. The circuits and methods set forth in more detail below may be implemented within a single integrated circuit die, or may be implemented in a multi-chip module.

Figure 2:
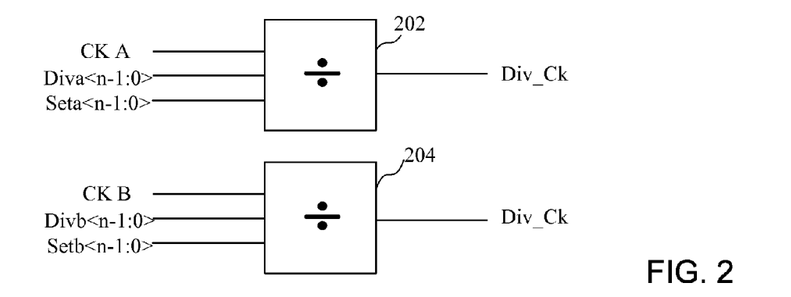
FIG. 2 is a block diagram of a portion of the clock circuit 120 of FIG. 1 showing control signals for two separate clock paths.

Turning now to FIG. 2, a block diagram of a portion of the clock circuit 120 of FIG. 1 shows control signals for two separate clock paths. In particular, a clock divider circuit 202 associated with a first clock signal (CK A) and a clock divider 204 associated with a second clock signal (CK B) are shown. The first clock divider circuit 202 is coupled to receive the CK A signal, as well as a divider select (Diva) signal for the CK A path comprising a divider control signal for each of the n stages of the clock divider circuit 202. The divider circuit 202 also receives set (Seta) signal for initializing values at nodes of the divider circuits of the CK A path, as described in more detail below in reference to FIGS. 6-9. The second clock divider 204 is coupled to receive the CK B signal, as well as a divider select (Divb) signal for the CK B path comprising a divider control signal for each of the n stages of the divider circuit 204. The divider circuit 204 also receives set (Setb) signal for clock initializing values at the nodes of the divider circuits of the CK B path. While circuits associated with a given CK A path or a CK B path are described below, it should be understood that the circuits described below could be implemented in both paths, and therefore enable the selection of a phase offset between the two clock paths. That is, while the circuits below enable generating a phase offset of a divided output clock signal with respect to an input clock signal, it should be understood that a desired phase relationship can be established between the two clock signals CK A and CK B. Alternatively, the same clock signal such as CK A could be provided to both divider circuits, and different clock signals having a known phase relationship but different phases with respect to each other can be selected.

Figure 3:
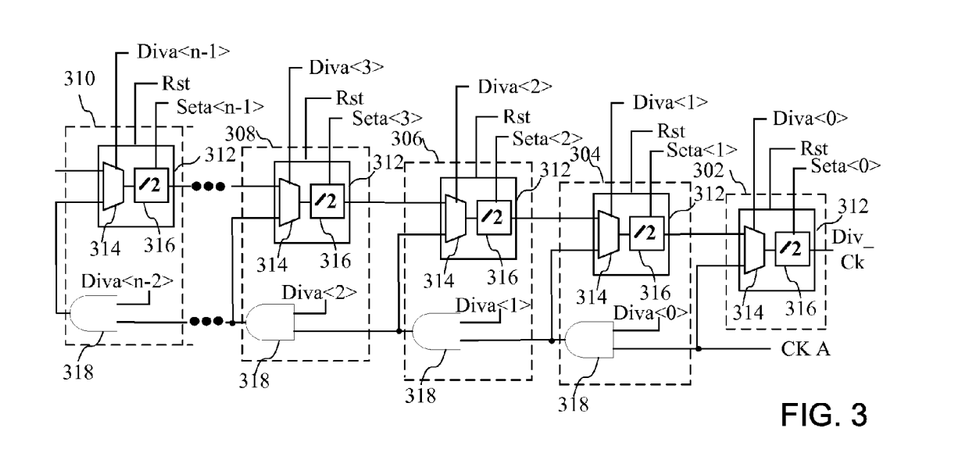
FIG. 3 is a block diagram of a portion of the clock circuit 120 of FIG. 1; having a plurality of clock divider stages.

Turning now to FIG. 3, a block diagram of a portion of the clock circuit 120 of FIG. 1 is shown. The clock circuit of FIG. 3, shown here associated with a circuit for dividing the CK A signal, comprises a plurality of clock divider stages 302-310 coupled in series, extending from a first stage 302 to a last clock divider stage 310. Each clock divider stage comprises a clock divider circuit 312 having a selection circuit 314, shown here as a multiplexer, and a clock divider 316 shown here as a "divide-by-2" circuit. Each clock divider stage further comprises AND gate 318. The selection circuit 314 and AND gate 318 compromise a control circuit for enabling the routing of a clock signal from one clock divider stage to another clock divider stage. However, it should be noted that the AND gate 318 is implemented to reduce the routing of the clock signal within the circuit, and the control circuit could be implemented without the AND gate, where the CK A signal is routed to each selection circuit 314. Each of the clock divider stages receives a set of corresponding input signals, including an initialization signal (Seta) and a divider (Diva) signal. As will be described in detail below, the divider signal determines the number of stages that are used to generate the divided output clock signal (and therefore the amount that the clock is divided) and the clock signal that is routed to a clock divider stage. The divider signal acts as a path select signal and determines whether a stage receives an output of the previous stage as a clock input or an output of the control circuit. That is, a given stage may receive either the clock output of a previous stage as a clock input, or an output of the AND gate 318, where the input clock signal CK A is routed by way of the AND gate 318 to the last stage selected to be a part of the clock divider circuit.

Figure 4:
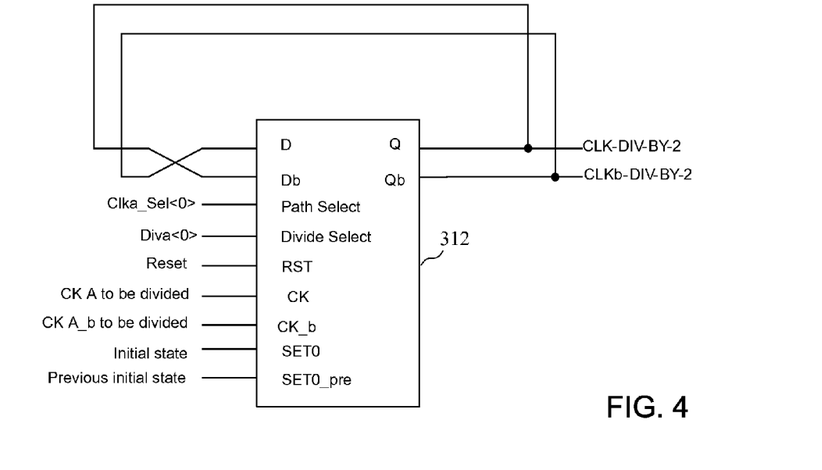
FIG. 4 is a block diagram of clock divider circuit 312 of FIG. 3 showing input control signals to a clock divider circuit.

Turning now to FIG. 4, a block diagram of clock divider circuit 312 of FIG. 3 shows input control signals to the clock divider circuit. In particular, FIG. 4 shows the signals provided to an individual stage to generate a clock signal which is divided by 2, where additional stages can be coupled in series to further divide the clock signal by 2, achieving a clock signal which is divided by 4, divided by 8, etc. The clock divider circuit 312 enables clock division by routing the outputs back to the inputs, where the output (Q) routed to an input for receiving an inverted input signal (Db), and the inverted output (Qb) is routed to an input for receiving, the input signal (D). The functions of an individual signals routed to a clock divider circuit will be described in more detail in reference to FIGS. 5-9.

Figure 5:
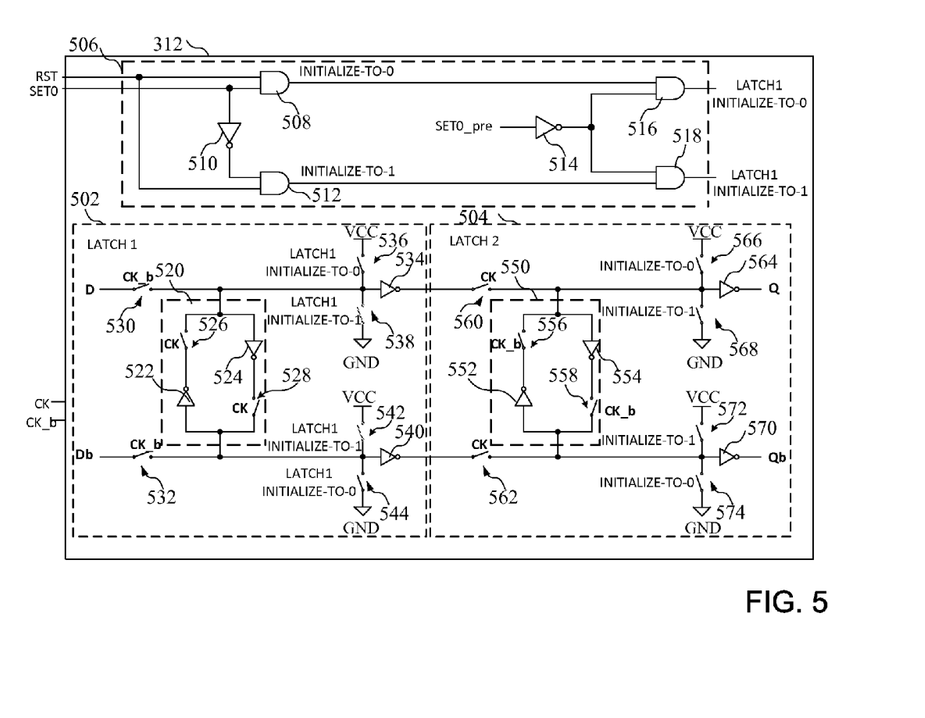
FIG. 5 is a block diagram of the clock divider circuit 312 of FIG. 3.

Turning now to FIG. 5, a block diagram of the clock divider 312 of FIG. 3 is shown. The clock divider 312 comprises a first latch circuit 502, and a second latch circuit 504 having inputs coupled to receive outputs of the first latch circuit 502. The clock divider also includes an initialization circuit 506 that generates initialization signals for controlling the operation of the first latch circuit and the second latch circuit. More particularly, the initialization circuit 506 comprises an AND gate 508 coupled to a reset (RST) signal and a SET0 signal. As will be described in more detail in reference to FIGS. 6-9, the SET0 signal and the previous SET0 signal (SET0_pre) are initialization signals that determine initialization values output by the initialization circuit 506 for controlling the operation of the first latch circuit and the second latch circuit.

The SET0 signal is also coupled to an inverter 510, the output of which is coupled to an input of an AND gate 512. The AND gate 512 also receive the reset (RST) signal at an input. A first initialization value (INITIALIZE-TO-1) is generated at the output of AND gate 508, and a second initialization value (INITIALIZE-TO-0) is generated at the output of AND gate 512. The SET0_pre signal (which is the SET0 signal from previous stage) is coupled to an inverter 514, the output of which is coupled to an input of each of the AND gates 516 and 518. The AND gate 516 also receive the first initialization value (INITIALIZE-TO-0) at an input, and generates a third initialization value (LATCH 1 INITIALIZE-TO-0). The AND gate 518 receives the second initialization value (INITIALIZE-TO-1) at an input, and generates a fourth initialization value (LATCH 1 INITIALIZE-TO-1).

The first latch circuit 502 comprises a latch 520 having cross-coupled inverters 522 and 524 as shown. The latch 520 is enabled by first and second switches 526 and 528 that are controlled by the clock signal (CK), which would be CK A for a clock divider in the Clock A path for example. In a circuit having multiple clock divider stages coupled in series, the clock and inverted clock signals coupled to a clock divider (other than the last clock divider stage) are outputs of the clock divider of a previous stage. The clock and inverted clock signals that control the switches 526, 528, 556, and 558 of the last stage of the plurality of stages are the CK A signal and inverted CK A signal. The switches 526, 528, 556, and 558, as well as other switches in the circuit of FIG. 5, could be transistor switches, for example. Switches 530 and 532, controlled by the inverted clock signal (CK_b), enable coupling the input data D and inverted input data Db to the latch. As will be described in detail in reference to FIGS. 6-9, outputs of the second latch are coupled back to opposite inputs of the first latch.

The switch 530 is also coupled to an input of an inverter 534, which is coupled to a pull-up switch 536 that enables pulling the input of the inverter 534 to a high value (e.g., Vcc) and to a pull-down switch 538 that enables pulling the input of the inverter 534 to a low value (e.g., ground). Similarly, the switch 532 is also coupled to an input of an inverter 540, which is coupled to a pull-up switch 542 that enables pulling the input of the inverter 540 to a high value (e.g., Vcc) and to a pull-down switch 544 that enables pulling the input of the inverter 540 to a low value (e.g., ground). As will be described in more detail below, the third and fourth initialization values (LATCH 1 INITIALIZE-TO-0 and LATCH 1 INITIALIZE-TO-1) control the setting of the inputs to and the outputs of the inverters 534 and 540.

The second latch circuit 504 comprises a latch 550 having cross-coupled inverters 552 and 554 as shown. The latch 550 is enabled by first and second switches 556 and 558 that are controlled by the inverted clock signal (CK_b). Switches 560 and 562, controlled by the clock signal (CK) respectively, enable coupling the output and inverted output of the first latch to the second latch circuit 504. The switch 560 is also coupled to an input of an inverter 564, which is coupled to a pull-up switch 566 that enables pulling the input of the inverter 564 to a high value and to a pull-down switch 568 that enables pulling the input of the inverter 564 to a low value. Similarly, the switch 562 is also coupled to an input of an inverter 570, which is coupled to a pull-up switch 572 that enables pulling the input of the inverter 570 to a high value and to a pull-down switch 574 that enables pulling the input of the inverter 570 to a low value. As will be described in more detail below, the first and second initialization values (INITIALIZE-TO-0 and INITIALIZE-TO-1) control the setting of the inputs to and the outputs of the inverters 564 and 570.

Figure 6:
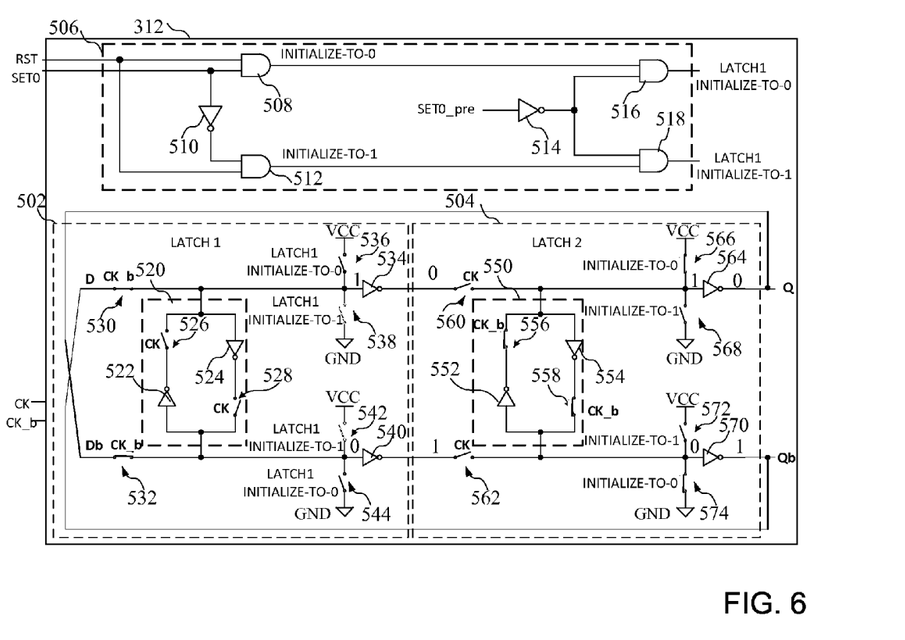
FIG. 6 is a block diagram of the clock divider circuit 312 of FIG. 3 according to a first implementation.

Turning now to FIG. 6-9, block diagrams of the clock divider circuit of FIG. 5 according to various implementations are shown. More particularly, each of the 4 possible combinations of the SET0 and SET0_pre value are provided. In each of the implementations of FIGS. 6-9, the reset (RST) value will be 1, enabling the normal operation of the initialization circuit. As shown in FIG. 6, when the when the SET0=1 and the SET0_pre=1 (where the set_pre value is the set value coupled to the immediately preceding clock divider), the switches 556 and 558 are closed on an active high inverted clock signal to enable the latch element 550, and switches 566 and 574 are closed to generate a logical "1" on the input to the inverter 564 (and therefore a logical "0" on the output of the inverter 564) and to generate a logical "0" on the input to the inverter 570 (and therefore a logical "1" on the output of the inverter 570).

Figure 7:
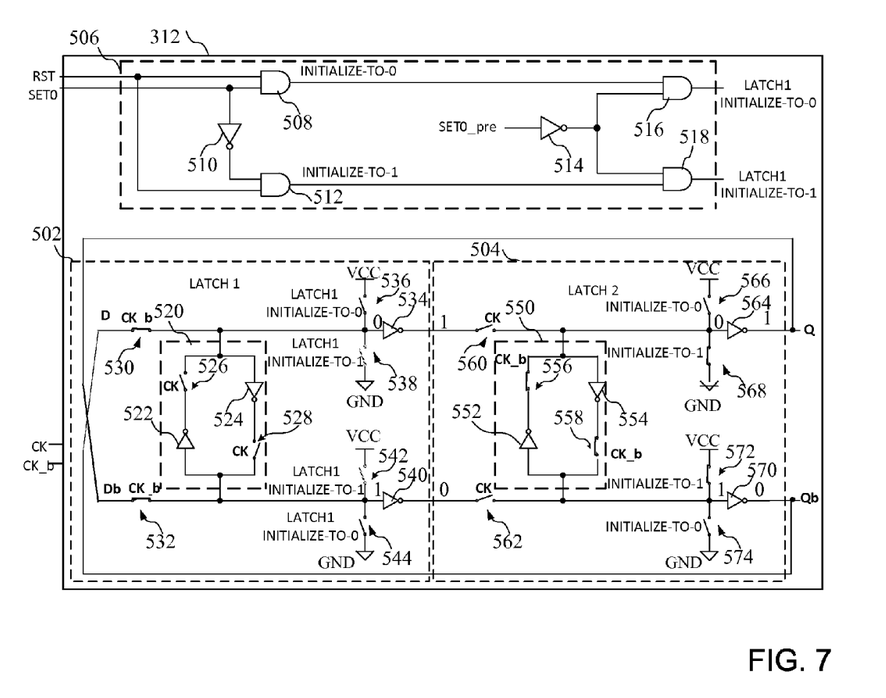
FIG. 7 is a block diagram of the clock divider circuit 312 of FIG. 3 according to a second implementation.

As shown in FIG. 7, when the SET0=0 and the SET0_pre=1, the switches 556 and 558 are closed on an active high inverted clock signal to enable the latch element 550, and switches 568 and 572 are closed to generate a logical "0" on the input to the inverter 564 (and therefore a logical "1" on the output of the inverter 564) and to generate a logical "1" on the input to the inverter 570 (and therefore a logical "0" on the output of the inverter 570).

Figure 8:
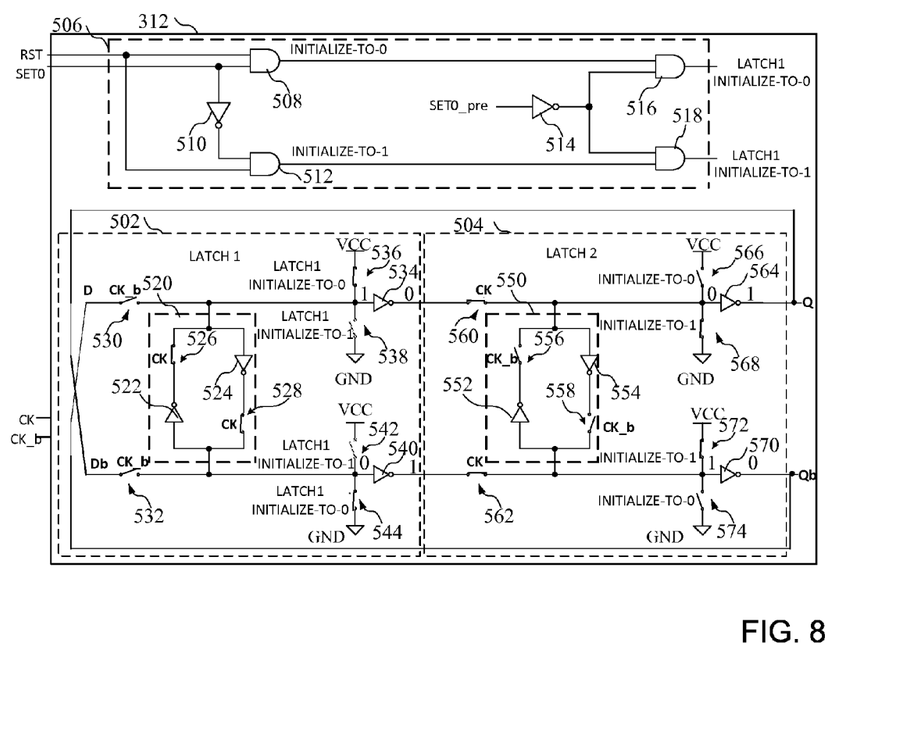
FIG. 8 is a block diagram of the clock divider circuit 312 of FIG. 3 according to a third implementation.

As shown in FIG. 8, when the SET0=0 and the SET0_pre=0, the switches 526 and 528 are closed on an active high clock signal to enable the latch element 520, and switches 568 and 572 are also closed to generate a logical "0" on the input to the inverter 564 (and therefore a logical "1" on the output of the inverter 564) and to generate a logical "1" on the input to the inverter 570 (and therefore a logical "0" on the output of the inverter 570). Switches 536 and 544 are also closed to generate a logical "1" on the input of the inverter 534 and a logical "0" on the input of inverter 540.

Figure 9:
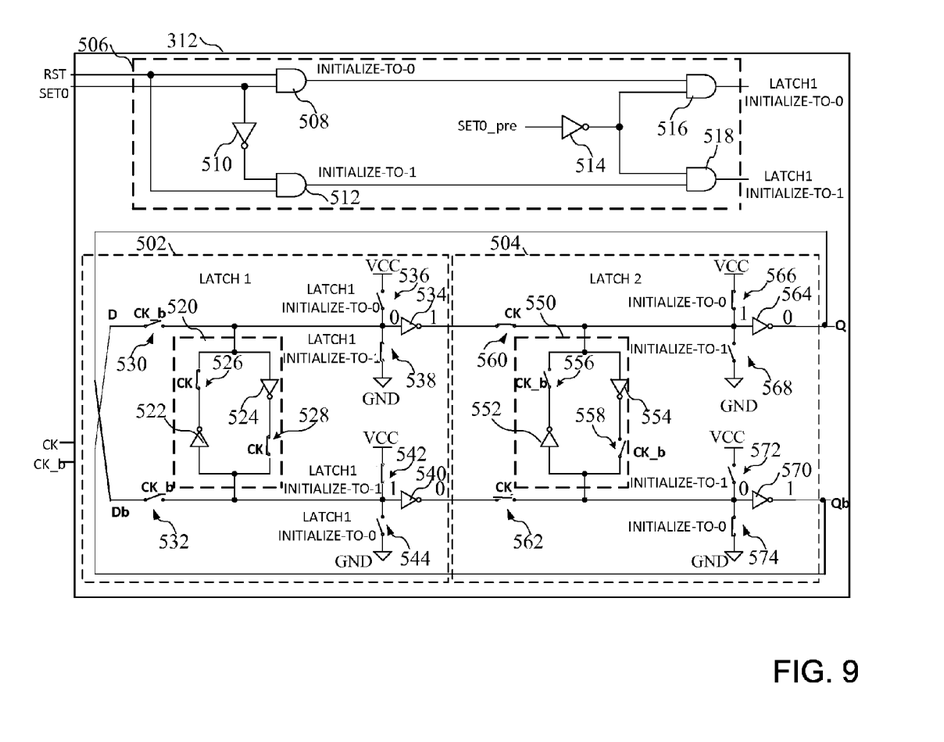
FIG. 9 is a block diagram of the clock divider circuit 312 of FIG. 3 according to a fourth implementation.

As shown in FIG. 9, when the SET0=1 and the SET0_pre=0, the switches 526 and 528 are closed on an active high signal to enable the latch element 520, and switches 566 and 574 are closed to generate a logical "1" on the input to the inverter 564 (and therefore a logical "0" on the output of the inverter 564) and to generate a logical "0" on the input to the inverter 570 (and therefore a logical "1" on the output of the inverter 570). Switches 538 and 542 are also closed to generate a logical "0" on the input of the inverter 534 and a logical "1" on the input of inverter 540. The generation of divided clock signals based upon a SET0 signal applied to a stage (and therefore SET0_pre signal applied to the stage and corresponding to the SET0 signal applied to the previous stage) will be described in FIGS. 10-12.

Figure 10:
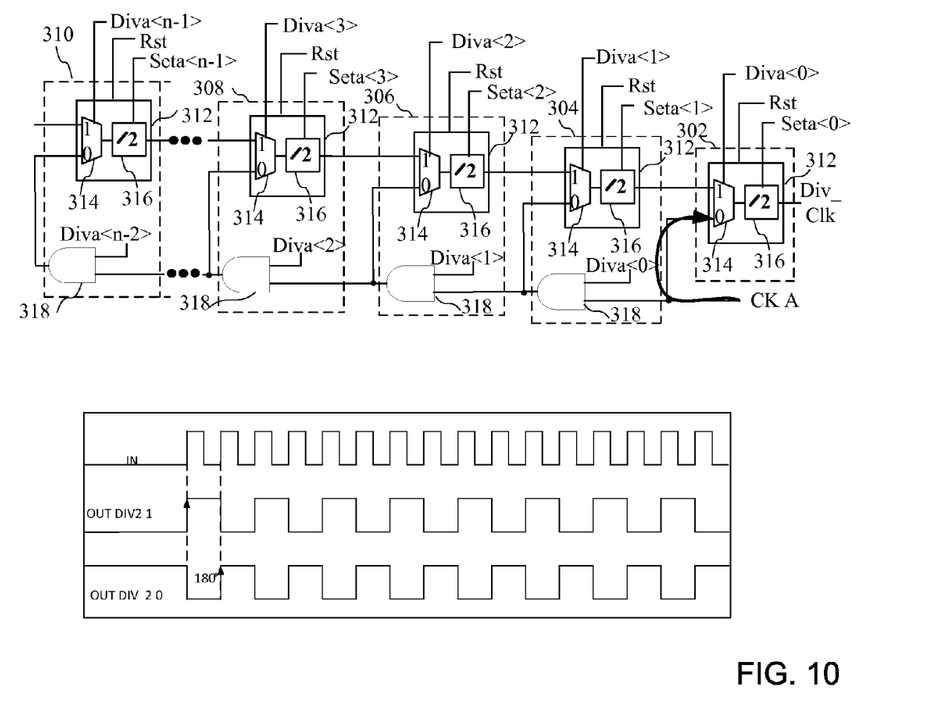
FIG. 10 is a block diagram showing the circuit of FIG. 3 configured to implement a divide-by-2 clock divider circuit.
Figure 11:
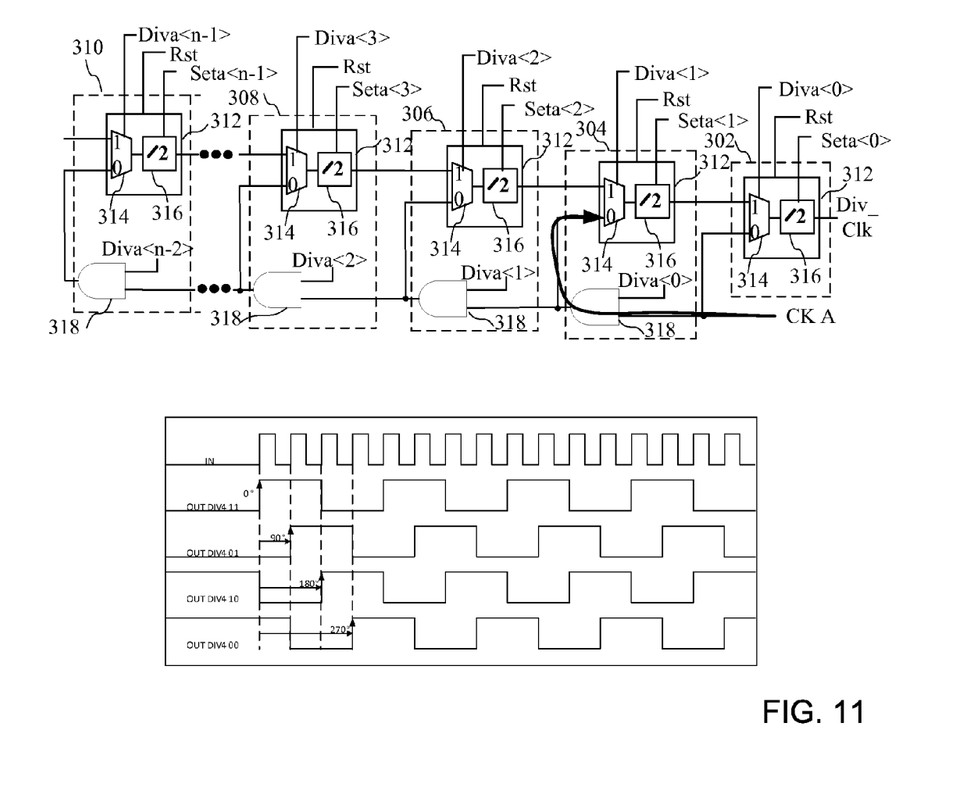
FIG. 11 is a block diagram showing the circuit of FIG. 3 configured to implement a divide-by-4 clock divider circuit.
Figure 12:
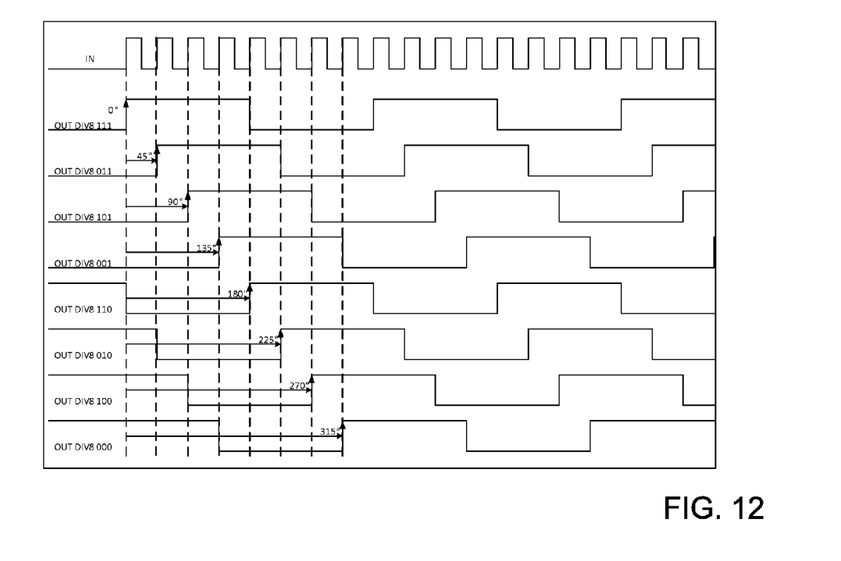
FIG. 12 is a block diagram showing the circuit of FIG. 3 configured to implement a divide-by-8 clock divider circuit.

Turning now to FIGS. 10-12, block diagrams show the circuit of FIG. 3 configured to implement a divide-by-2, divide-by-4, and divide-by-8 clock divider circuits, respectively. More particularly, FIG. 10 implements a single stage (i.e., stage 302) divider circuit, which is configured to route the CK A signal to the clock divider 316, and generates a divided output clock signal (Div_Clk) which is at one half the output clock rate. The desired phase of the divided output clock signal can be selected based upon the SET0 value and the SET0_pre value (which would correspond to the SET0 of the previous stage as set forth above in reference to FIG. 6-9), according to the following table having the following SET0 values:

| Divider Circuit 304 | Divider Circuit 302 | Phase Offset (Degrees) |
|---|---|---|
| 1 | 1 | 0 |
| 1 | 0 | 180 |

Accordingly, if a SET0 value of 1 is provided as the set value to each of clock divider stages 304 and 302 (and therefore a SET0_pre value of 1 is provided to the clock divider stage 302), then the divided output clock signal which is a divide-by-two clock signal will not have a phase shift with respect to the input clock. However, if a SET0 value of 1 is provided to the clock divider stage 304 (and therefore a SET0_pre value of 1 is provided to the clock divider stage 302) and a SET0 value of 0 is provided to the clock divider stage 302, then the divided output clock signal will have a phase offset of 180 degrees. As can be seen, the Div_Clk signal is a divided clock signal having a configurable phase offset, where the offset can be 180 degrees based upon the selection of the SET0 signal coupled to the clock divider stages 302 and 304. The selection of SET0 values for the divider stages can be implemented using configuration bits, for example, as described in more detail below in reference to FIGS. 13-15.

Accordingly, the single stage implementation of FIG. 10 is configured by applying logical "0s" for all the Diva inputs. The selection of the appropriate input to the clock divider 316 (i.e., the correct clock and inverted clock signals) is provided by the clock select signal Diva for that stage, which enables the selection of the CK A signal as the clock input, rather than outputs of a previous stage as a clock input. Because the remaining clock divider stages 304-310 are not used, the Diva signal is not necessary. It should be noted that AND gates 318 are provided to minimize the routing of the clock signal in the circuit.

By implementing multiple stages, outputs having smaller phase differences can be selected. By way of example, if there are two separate divide-by-2 FFs that receive the same input clock, it is possible to set the outputs to be at different phases. If the first FF (FF_A) is initialized to state 0 (i.e., it's output is initialized to low during reset) and the second FF (FF_B) is initialized to state 1 (i.e., its output is initialized to high during reset), then the outputs of the two FFs will be 180 degrees out of phase relative to each other. The FF_A output rising edges will be aligned with the input clock, while the FF_B output rising edges will be 180 degrees out of phase relative to the output of FF_A. Therefore, depending on initial state, the FF outputs can be 180 degrees different in phase. If the output of FF_A is then feed to another divide-by-2 FF (FF_C) initialized to state 0, and the output of FF_B is also similarly fed to another divide-by-2 FF (FF_D) initialized to state 0, the outputs of FF_C and FF_D will be 90 degrees out of phase relative to each other because the relative phase difference of 180 degrees at the inputs of FF_C and FF_D is divided down by 2.

FIG. 11 implements a two stage clock divider, which is configured to receive the CK A signal to the clock divider 316 of the clock divider stage 304, and generates a divided output clock signal (Div_Clk) which is at one quarter the input clock rate. That is, two "divide-by-2" stages are coupled in series to generate a divide-by-4 clock divider circuit. The dual stage implementation of FIG. 11 enabling clock signals which are 90 degrees out of phase is configured by applying the Diva<0> input of a logical "1" and logical "0s" for the remaining Diva inputs to the remaining stages, and providing the appropriate SET0 values. That is, the selection of the appropriate input to the clock divider 316 of the first and second clock divider stages 302 and 304 (i.e., the correct clock and inverted clock signals for those stage) is provided by the clock select signals Diva<0> and Diva<1>, which enable the selection of the CK A signal as the clock input to the clock divider stage 304, and outputs of the clock divider stage 304 as a clock input to the clock divider stage 302, as shown by the bold line. The desired phase of the divided output clock signal can be selected based upon the SET0 value and the SET0_pre value (which would correspond to the SET0 of the previous stage) to the clock divider stages 302-306, according to the following table having the following SET0 values:

| Divider Stage 306 | Divider Stage 304 | Divider Stage 302 | Phase Offset |
|---|---|---|---|
| 1 | 1 | 1 | 0 |
| 1 | 0 | 1 | 90 |
| 1 | 1 | 0 | 180 |
| 1 | 0 | 0 | 270 |

The SET0 value to clock divider stage 306 is shown to indicate the SET0_pre value to the clock divider stage 304. That is, although the clock divider stage 306 is not used for generating a divide-by-4 clock signal, the SET0 value coupled to the clock divider stage 306 is also coupled to the clock divider stage 304 as a SET0_pre value. Accordingly, the Div_Clk signal is a divided output clock signal having a configurable phase offset, where the offset can be 90 degrees based upon the selection of the SET0 signal coupled to the clock divider stages 302-306.

FIG. 12 implements is configured to provide output clocks signals at one eighth of the input clock rate and having a phase offset of 45 degrees. The desired phase of the divided output clock signal can be selected based upon the SET0 value according to the following table:

| Divider Stage 308 | Divider Stage 306 | Divider Stage 304 | Divider Stage 302 | Phase Offset |
|---|---|---|---|---|
| 1 | 1 | 1 | 1 | 0 |
| 1 | 0 | 1 | 1 | 45 |
| 1 | 1 | 0 | 1 | 90 |
| 1 | 0 | 0 | 1 | 135 |
| 1 | 1 | 1 | 0 | 180 |
| 1 | 0 | 1 | 0 | 225 |
| 1 | 1 | 0 | 0 | 270 |
| 1 | 0 | 0 | 0 | 315 |

Accordingly, a Div_Clk signal being a divided clock signal and having any desirable configurable phase offset can be selected based upon the number of stages that are cascaded and the SET0 values input to the stages.

Figure 13:
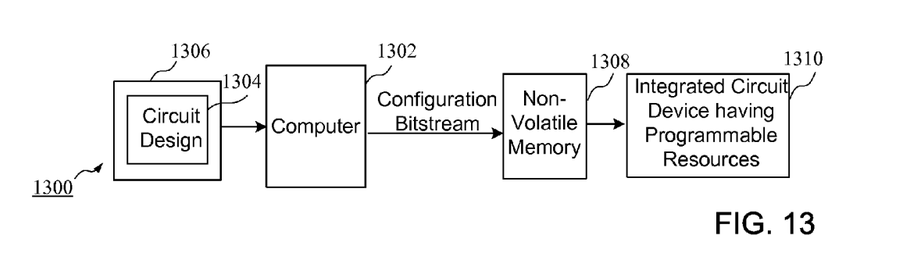
FIG. 13 is a block diagram of a system for programming a device having programmable resources.

Turning now to FIG. 13, a block diagram of a system for programming a device having programmable resources according to an embodiment is shown. In particular, a computer 1302 is coupled to receive a circuit design 1304 from a memory 1306, and generates a configuration bitstream that is stored in the non-volatile memory 1306. As will be described in more detail below, the circuit design may be a high level design, such as a circuit design defined in a hardware description language (HDL). Also, the computer may be configured to run software that generates a configuration bitstream that is stored in the non-volatile memory 1308 and provided to an integrated circuit 1310 that may be a programmable integrated circuit, such as the integrated circuit described below in FIG. 14. As will be described in more detail below, bit of the configuration bitstream are used to configure programmable resources of the integrated circuit.

Figure 14:
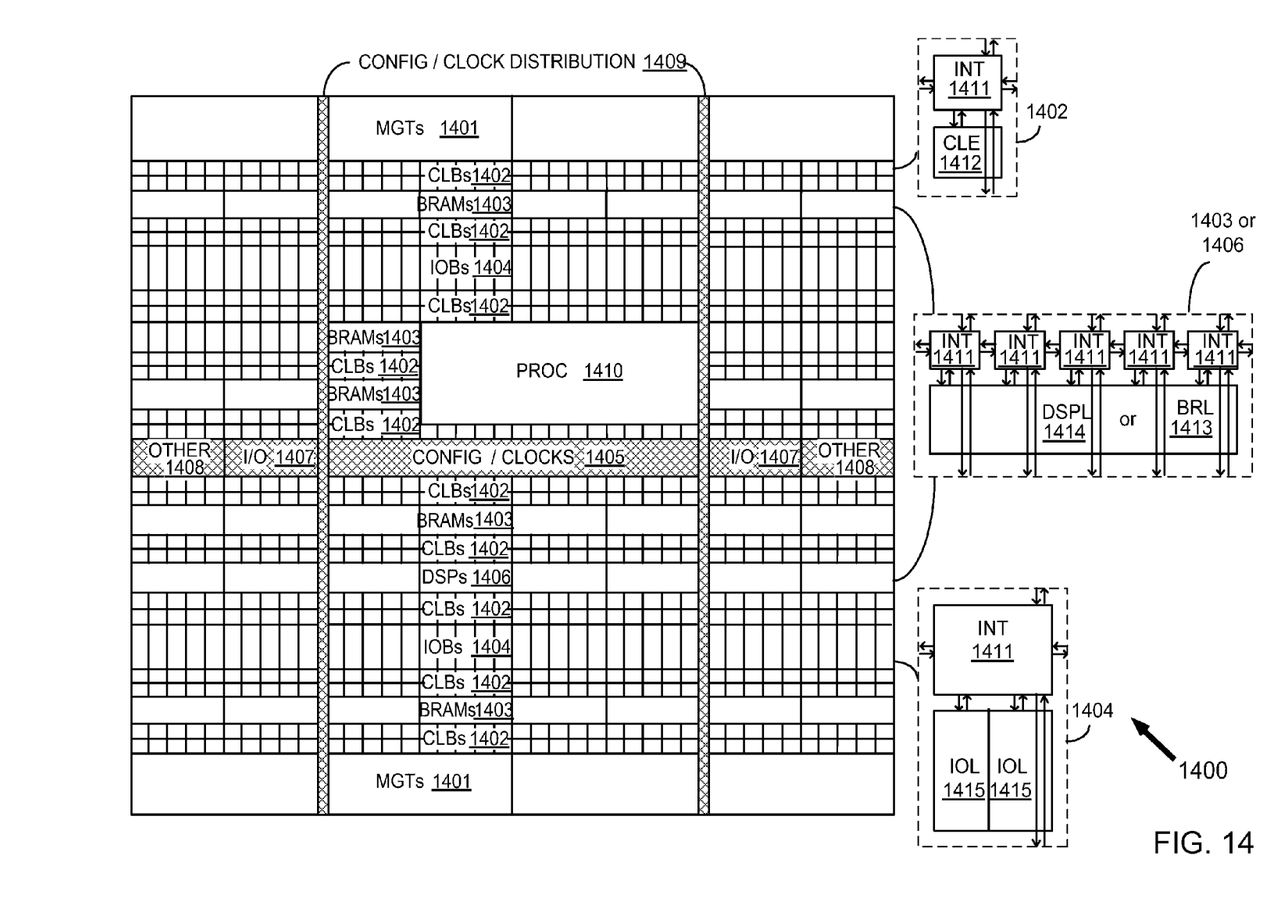
FIG. 14 is a block diagram of a device having programmable resources.

Turning now to FIG. 14, a block diagram of a device having programmable resources including the circuits of FIGS. 1-12 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 14 comprises an FPGA architecture 1400 having a large number of different programmable tiles including multi-gigabit transceivers (MGTs) 1401, CLBs 1402, random access memory blocks (BRAMs) 1403, input/output blocks (IOBs) 1404, configuration and clocking logic (CONFIG/CLOCKS) 1405, digital signal processing blocks (DSPs) 1406, specialized input/output blocks (I/O) 1407 (e.g., configuration ports and clock ports), and other programmable logic 1408 such as digital clock managers, analog-to-digital converters, system monitoring logic, and so forth. Some FPGAs also include dedicated processor blocks (PROC) 1410, which may be used to implement a software application, for example.

In some FPGAs, each programmable tile includes a programmable interconnect element (INT) 1411 having standardized connections to and from a corresponding interconnect element in each adjacent tile. Therefore, the programmable interconnect elements taken together implement the programmable interconnect structure for the illustrated FPGA. The programmable interconnect element 1411 also includes the connections to and from the programmable logic element within the same tile, as shown by the examples included at the top of FIG. 14.

For example, a CLB 1402 may include a configurable logic element (CLE) 1412 that may be programmed to implement user logic plus a single programmable interconnect element 1411. A BRAM 1403 may include a BRAM logic element (BRL) 1413 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1406 may include a DSP logic element (DSPL) 1414 in addition to an appropriate number of programmable interconnect elements. An IOB 1404 may include, for example, two instances of an input/output logic element (IOL) 1415 in addition to one instance of the programmable interconnect element 1411. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 1409 extending from this column are used to distribute the clocks and configuration signals across the breadth of the FPGA. Some FPGAs utilizing the architecture illustrated in FIG. 14 include additional logic blocks that disrupt the regular columnar structure making up a large part of the FPGA. The additional logic blocks may be programmable blocks and/or dedicated logic. For example, the processor block PROC 1410 shown in FIG. 14 spans several columns of CLBs and BRAMs.

Note that FIG. 14 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 14 are purely exemplary. For example, in an actual FPGA more than one adjacent column of CLBs is typically included wherever the CLBs appear in order to facilitate the efficient implementation of user logic. While the embodiment of FIG. 14 relates to an integrated circuit having programmable resources, it should be understood that the circuits and methods set forth in more detail below could be implemented in any type of ASIC.

Figure 15:
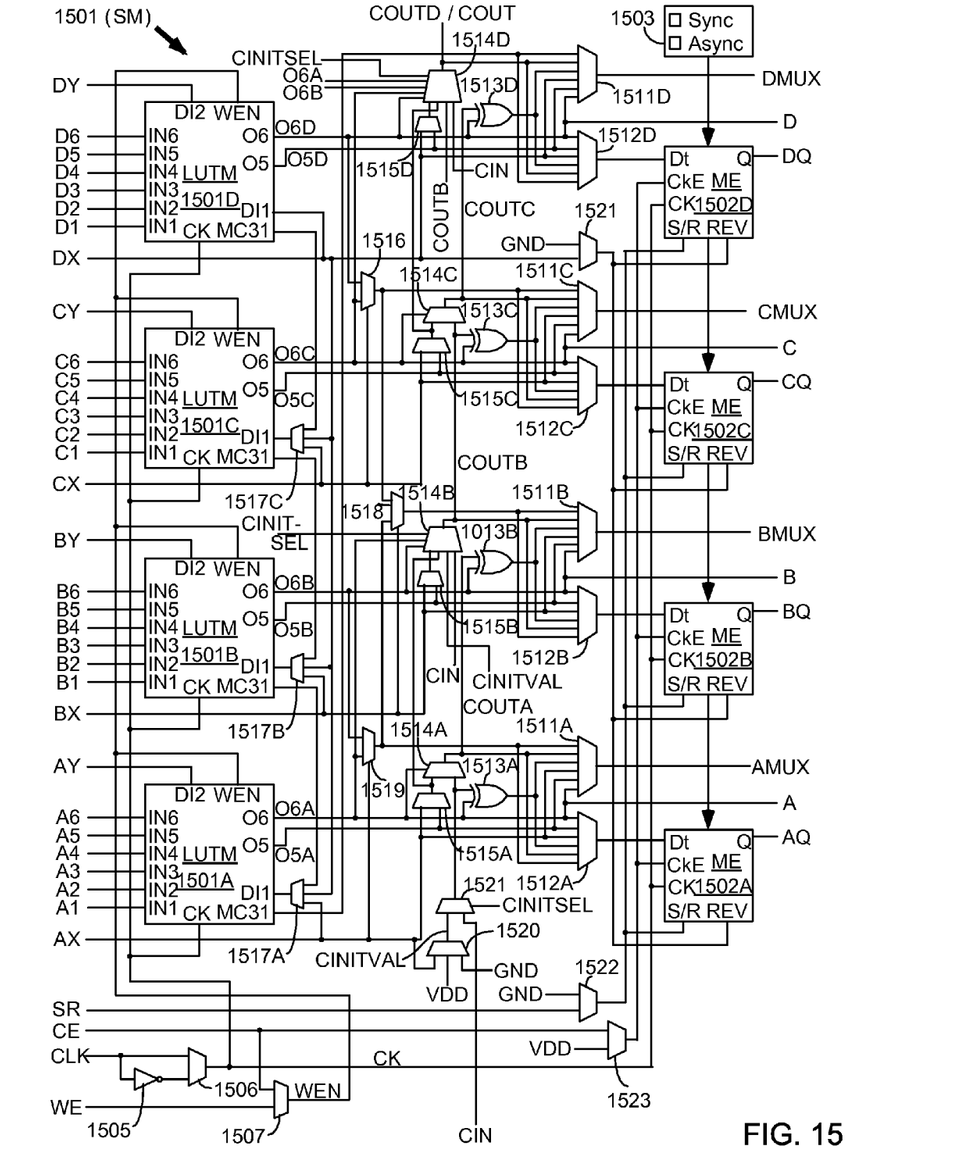
FIG. 15 is a block diagram of a configurable logic element of the device of FIG. 14.

Turning now to FIG. 15, block diagram of a configurable logic element of the device of FIG. 14 is shown. In particular, FIG. 15 illustrates in simplified form a configurable logic element of a configuration logic block 1402 of FIG. 14. In the embodiment of FIG. 15, slice M 1501 includes four lookup tables (LUTMs) 1501A-1501D, each driven by six LUT data input terminals A1-A6, B1-B6, C1-C6, and D1-D6 and each providing two LUT output signals O5 and O6. The O6 output terminals from LUTs 1501A-1501D drive slice output terminals A-D, respectively. The LUT data input signals are supplied by the FPGA interconnect structure via input multiplexers, which may be implemented by programmable interconnect element 1511, and the LUT output signals are also supplied to the interconnect structure. Slice M also includes: output select multiplexers 1511A-1511D driving output terminals AMUX-DMUX; multiplexers 1512A-1512D driving the data input terminals of memory elements 1502A-1502D; combinational multiplexers 1516, 1518, and 1519; bounce multiplexer circuits 1522-1523; a circuit represented by inverter 1505 and multiplexer 1506 (which together provide an optional inversion on the input clock path); and carry logic having multiplexers 1514A-1514D, 1515A-1515D, 1520-1521 and exclusive OR gates

1513A-1513D. All of these elements are coupled together as shown in FIG. 15. Where select inputs are not shown for the multiplexers illustrated in FIG. 15, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 10 for clarity, as well as from other selected figures herein.

In the pictured embodiment, each memory element 1502A-1502D may be programmed to function as a synchronous or asynchronous flip-flop or latch. The selection between synchronous and asynchronous functionality is made for all four memory elements in a slice by programming Sync/Asynch selection circuit 1503. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1502A-1502D are clocked by a clock signal CK, which may be provided by a global clock network or by the interconnect structure, for example. Such programmable memory elements are well known in the art of FPGA design. Each memory element 1502A-1502D provides a registered output signal AQ-DQ to the interconnect structure. Because each LUT 1501A-1501D provides two output signals, O5 and O6, the LUT may be configured to function as two 5-input LUTs with five shared input signals (IN1-IN5), or as one 6-input LUT having input signals IN1-IN6.

In the embodiment of FIG. 15, each LUTM 1501A-1501D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1517A-1517C for LUTs 1501A-1501C), or to the two 32-bit RAMs via input terminals DI1 and DI2. RAM write operations in the LUT RAMs are controlled by clock signal CK from multiplexer 1506 and by write enable signal WEN from multiplexer 1507, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1501A may also be provided to the general interconnect structure for shift register chaining, via output select multiplexer 1511D and CLE output terminal DMUX. Accordingly, the circuits and methods set forth above may be implemented in a device such as the devices of FIGS. 14 and 15, or any other suitable device.

Figure 16:
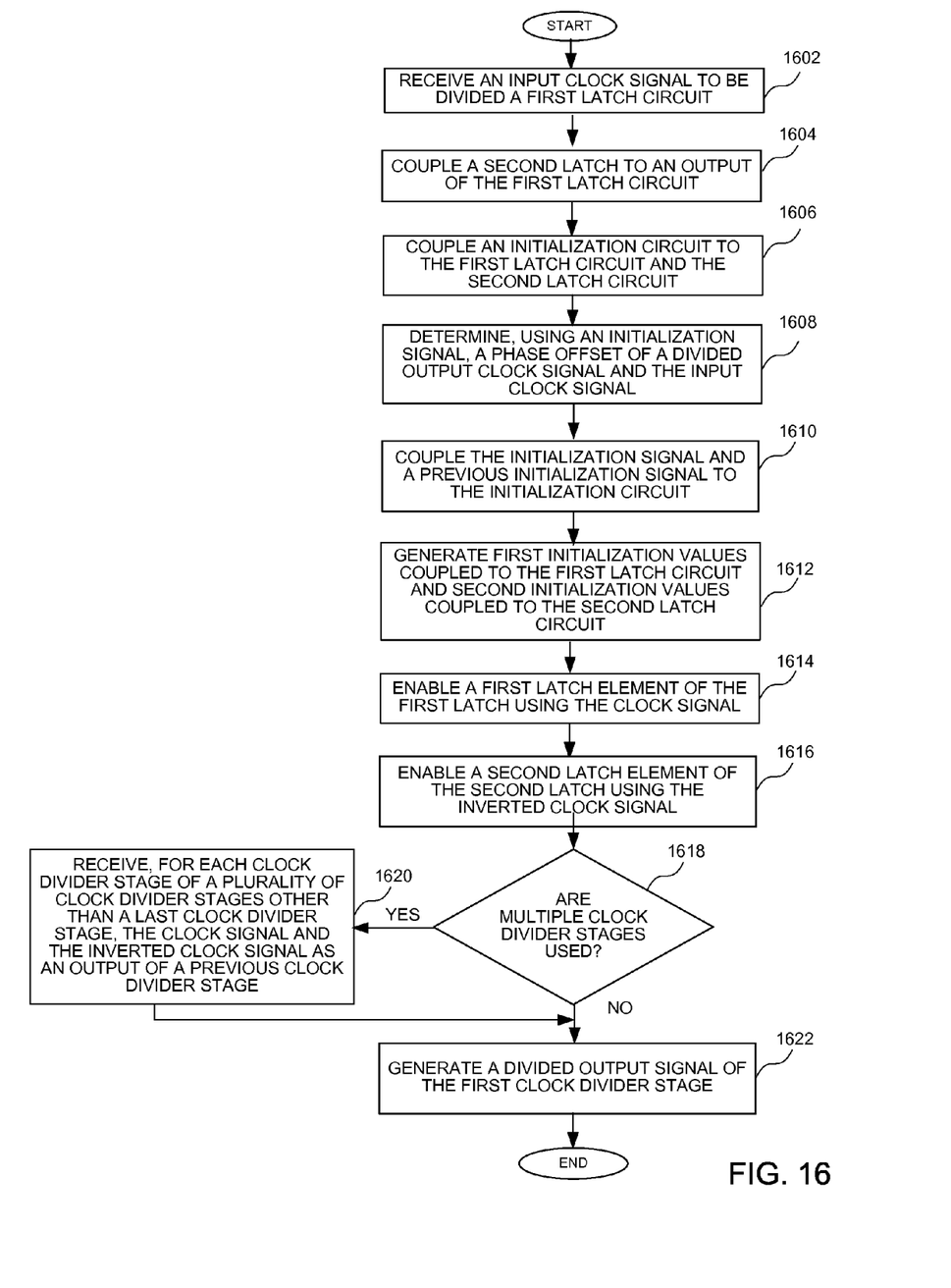
FIG. 16 is a flow chart showing a method of generating a divided clock signal with a configurable phase offset.

Turning now to FIG. 16, a flow chart shows a method of generating a divided clock signal with a configurable phase offset. In particular, an input clock signal is received at a first latch circuit at a block 1602, and a second latch is coupled to an output of the first latch circuit at a block 1604. An initialization circuit is coupled to the first latch circuit and the second latch circuit at a block 1606. A phase offset of a divided output clock signal and a clock signal to be divided is determined, using an initialization signal, at a block 1608. The initialization signal and a previous initialization signal is coupled to the initialization circuit at a block 1610. First initialization values coupled to the first latch circuit and second initialization values coupled to the second latch circuit are generated at a block 1612. The first and second initialization values control switches of the first and second latch circuits to set values at outputs of the first and second latch circuits, as described in reference to FIGS. 6-9. A first latch element of the first latch is enabled using the clock signal at a block 1614. A second latch element of the second latch is enabled using the inverted clock signals at a block 1616. It is then determined whether multiple clock divider stages are used at a block 1618. If so, the clock signal and the inverted clock signal are received, for each clock divider stage of a plurality of clock divider stages other than a second clock divider stage, as an output of a previous clock divider stage at a block 1620. That is, each stage is configured to receive the outputs of a previous stage as clock inputs, where multiple stages may be implemented to achieve the correct clock division as described in reference to FIGS. 10-12. A divided output signal of the first clock divider stage is generated at a block 1622.

The method of FIG. 16 may be implemented using any of the circuits of FIGS. 1-15 as described above. While certain elements of the method are shown in FIG. 16, it should be understood that additional information related to, or additional elements of, the method could be implemented as described for the circuits of FIGS. 1-15.

It can therefore be appreciated that new circuits for and methods of generating a divided clock signal with a configurable offset has been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for generating a divided clock signal with a configurable phase offset, the circuit comprising:
   a clock divider circuit comprising a first latch circuit and a second latch circuit;
   wherein the first latch circuit is adapted to receive a clock signal to be divided;
   wherein the second latch circuit is coupled to an output of the first latch circuit and generates a divided output clock signal; and
   an initialization circuit coupled to the first latch circuit and the second latch circuit, the initialization circuit coupled to receive an initialization signal and a previous initialization signal coupled to a previous clock divider circuit;
   wherein the initialization circuit generates first initialization values, based upon the initialization signal and the previous initialization signal, provided to the first latch circuit, and second initialization values, based upon the initialization signal, provided to the second latch circuit; and
   wherein the initialization signal and the previous initialization signal determine a phase offset between the divided output clock signal and the clock signal to be divided.

2. The circuit of claim 1, wherein:
the first latch circuit comprises a first latch element and a first plurality of control switches; and
the clock signal is coupled to enable the first latch element.

3. The circuit of claim 2, wherein the first initialization values comprise a first logical zero initialization value and a first logical one initialization value that enable setting a node of the first latch circuit to a predetermined value.

4. The circuit of claim 1, wherein the second latch circuit comprises a second latch element and a second plurality of control switches, wherein an inverted clock signal is coupled to enable the second latch element.

5. The circuit of claim 4, wherein the second initialization values comprise a second logical zero initialization value and a second logical one initialization value that enable setting a node of the second latch circuit to a predetermined value.

6. A method of generating a divided clock signal with a configurable phase offset, the method comprising:
implementing a clock divider circuit comprising a first latch circuit and a second latch circuit;
receiving an input clock signal to be divided at the first latch circuit;
coupling the second latch circuit to an output of the first latch circuit;
coupling an initialization circuit to the first latch circuit and the second latch circuit;
determining, using an initialization signal and a previous initialization signal coupled to a previous clock divider circuit, a phase offset between a divided output clock signal and the input clock signal;
generating first initialization values provided to the first latch circuit based upon the initialization signal and the previous initialization signal; and
generating second initialization values provided to the second latch circuit based upon the initialization signal.

7. The method of claim 6, wherein:
the first latch circuit comprises a first latch element and a first plurality of control switches; and
the method further comprises enabling the first latch element using the clock signal.

8. The method of claim 7, wherein:
the second latch circuit comprises a second latch element and a second plurality of control switches; and
the method further comprises enabling the second latch element using the inverted clock signals.

9. The method of claim 8, further comprising receiving, for each clock divider stage of a plurality of clock divider stages other than a last clock divider stage, the clock signal and the inverted clock signal as an output of a previous clock divider stage.

* * * * *